United States Patent [19]

Hurd et al.

[11] Patent Number: 5,077,524

[45] Date of Patent: Dec. 31, 1991

[54] GRADIENT ENHANCED NMR CORRELATION SPECTROSCOPY

[75] Inventors: Ralph E. Hurd, Milpitas; Michael G. Boucher, Fremont, both of Calif.

[73] Assignee: General Elecric, Milwaukee, Wis.

[21] Appl. No.: 534,593

[22] Filed: Jun. 7, 1990

Related U.S. Application Data

[63] Continuation-in-part of Ser. No. 276,173, Nov. 25, 1988.

[51] Int. Cl.[5] .............................................. G01R 33/20
[52] U.S. Cl. ..................................... 324/318; 324/322
[58] Field of Search ............... 324/307, 309, 318, 320, 324/322; 128/653 A

[56] References Cited

U.S. PATENT DOCUMENTS

| | | | |
|---|---|---|---|
| 4,698,592 | 10/1987 | Feinberg | 324/309 |
| 4,737,716 | 4/1988 | Roemer et al. | 324/319 |
| 4,825,159 | 4/1989 | Oppelt et al. | 324/309 |
| 4,833,411 | 5/1989 | McDonald et al. | 324/307 |
| 4,893,081 | 1/1990 | Zur | 324/309 |
| 4,970,465 | 11/1990 | Hagiwara | 324/309 |
| 4,978,920 | 12/1990 | Mansfield, et al. | 324/318 |

OTHER PUBLICATIONS

"Separation of the Different Orders of NMR Multiple-Quantum Transitions by the Use of Pulsed Field Gradients;", by A. Bax et al., CHEMICAL PHYSICS LETTERS, Feb. 1, 1980, vol. 69, No. 3, pp. 567-570.

*Primary Examiner*—Michael J. Tokar
*Attorney, Agent, or Firm*—Quarles & Brady

[57] ABSTRACT

A method for obtaining high resolution NMR spectra without the need for phase cycling includes the application of magnetic field gradient pulses to select specific coherences. By using actively shielded gradients, a gradient pulse is applied during the evolution period of the selected coherence to dephase the transverse magnetization and another gradient pulse refocuses the desired coherences remaining during the acquisition period.

3 Claims, 4 Drawing Sheets

GRADIENT ENHANCED NMR CORRELATION SPECTROSCOPY

RELATED APPLICATIONS

This application is a continuation-in-part of co-pending U.S. patent application Ser. No. 276,173, filed on Nov. 25, 1988 and entitled "NMR Imaging of Metabolites Using A Multiple Quantum Excitation Sequence."

BACKGROUND OF THE INVENTION

The field of the invention is nuclear magnetic resonance (NMR) spectroscopy, and particularly, methods and apparatus for producing two-dimensional and three-dimensional correlation spectra.

Atomic nuclei having net magnetic moments placed in static magnetic field $B_0$, oscillate or precess about the axis of field $B_0$ at an NMR (Larmor) frequency $\omega$ given by the equation $$\omega = \gamma B_0 \tag{1}$$

in which $\gamma$ is the gyro-magnetic ratio (constant for each NMR isotope). The frequency at which the nuclei precess is thus proportional to the strength of the static magnetic field $B_0$. Chemical shifts occur where the NMR frequency of resonant nuclei of the same type in a given molecule differ because of different magnetic environments produced by differences in their chemical environment. For example, electrons partially screen the nucleus from the magnetic field and thereby affect its resonant frequency. The degree of shielding caused by the electrons depends on the environment of the nucleus, and thus the chemical shift spectrum of a given molecule is unique and can be used for identification. Because the resonant frequency, hence the absolute chemical shift, is dependent on the strength of the applied field, the chemical shift spectrum is expressed as a fractional shift in parts-per-million (ppm) of the NMR frequency relative to an arbitrary reference compound. By way of illustration, the range of chemical shifts is about 10 ppm for protons ($^1H$). In order to discern such small chemical shifts, the homogeneity of field $B_0$ must exceed the differences in chemical shifts of the peaks in the spectrum and typically is much better than 1 part in $10^7$ (0.1 ppm).

Another important characteristic of NMR spectra is scalar (or J) coupling. This through-bond interaction of nuclei gives rise to a fine structure which is observed as multiple splitting of resonances. These interactions give rise to multiple quantum energy states and can be exploited via 2 and 3 dimensional spectroscopy to correlate and identify resonances from nuclei which are connected through chemical bonds. These data are referred to as correlation maps.

To produce such correlation maps the NMR data is "frequency labelled" using a series of RF excitation pulses which maneuver the magnetization to take advantage of the couplings between adjacent hydrogen nuclei. One class of such measurements is known as "J-spectra" measurements and another class is known as "shift correlation" measurements. The present invention relates to this latter class of measurements.

One such well known 2D correlation NMR measurement, commonly called "COSY", is illustrated in FIG. 1. This sequence is characterized by a pair of 90° RF excitation pulses which are separated by a time period $t_1$ during which the transverse magnetization produced by the first RF pulse evolves. When the second RF pulse occurs, magnetization states are mixed and a coherence echo signal is observed at time $2t_1$ which is sampled over a time interval $t_2$. In a 2D scan, a series of these measurements are conducted in which the evolution period $t_1$ is incremented through a set of values ("dwell times") and a two-dimensional array of NMR data is acquired. A two-dimensional Fourier transform is then performed on this data producing a 2D spectrum which correlates chemical shifts. The signal on the diagonal of the 2D spectrum contains conventional, chemical shift information and off-diagonal signal ("cross-peaks") give the correlations.

While the COSY measurement is able to correlate coupled nuclei and produce a map which enables one to determine correlations, there are a number of constraints on this method which require that enormous amounts of data be acquired over prolonged periods of time. More specifically, each measurement must be made from 4 to 16 times for each value of $t_1$ in a COSY sequence, and up to 128 times for more sophisticated sequences, such as double quantum filtered COSY ("DQ COSY"). For example, to eliminate axial peaks caused by residual longitudinal magnetization that is tipped into the transverse plane by the second RF pulse, a second measurement is made in which the phase of the second RF excitation pulse is reversed and the NMR data signals are added together. The desired signals add together and the signals produced by the residual longitudinal magnetization is cancelled. Also, to suppress quadrature images and other artifacts along the fl chemical shift axis, the phase of each RF pulse and the receiver are cycled in a procedure known as CYCLOPS and the four signals are combined. When CYCLOPS is combined with the axial peak suppression method, therefore, at least eight measurements at each $t_1$ value must be made. If quadrature detection is desired, this number is increased to sixteen measurements and other procedures may require up to thirty-two measurements at each $t_1$ value. As a result, the minimum number of measurements required for a typical 2D image may range from 8 to 32 and require from 30 to 120 minutes to perform.

In addition to the enormous amount of data that must be acquired and the lengthy time needed to acquire it, these "phase cycling" methods of selecting quantum coherence also presume that measurement conditions remain constant during the entire procedure. Such stability is required because phase cycling methods rely on subtractive techniques in which unwanted signals of equal magnitude are nulled, leaving the desired signal as the difference. In some cases stable measurement conditions cannot be maintained with sufficient accuracy to successfully use phase cycling sequences.

While the limitations in the prior art have been explained with respect to a particular single quantum coherence selection pulse sequence (COSY), it should be apparent to those skilled in the art that the problem exists in any pulse sequence in which quantum coherence is selected by the application of an RF excitation pulse to the spin system. Indeed, in higher order quantum coherence selection sequences it is not uncommon to require as many as 128 phase cycles to acquire accurate data for a single evolution period.

SUMMARY OF THE INVENTION

The present invention is an improvement to NMR measurements in which precise magnetic field gradient pulses are employed for coherence selection. More specifically, the invention relates to an NMR measurement sequence in which a first RF excitation pulse is applied to the subject in the presence of a polarizing magnetic field to produce transverse magnetization, a first magnetic field gradient pulse is applied to the subject to dephase the transverse magnetization by a selected amount, a second RF excitation pulse is applied to the subject after an evolution period $t_1$ to select a specific coherence, a second magnetic field gradient is applied to the subject to rephase the transverse magnetization by the selected amount, and the NMR signal produced by the transverse magnetization is acquired and digitized. This pulse sequence is repeated for discrete values of the evolution time $t_1$ and an array of NMR data is acquired from which a correlation map is reconstructed.

A general object of the invention is to reduce the number of measurement cycles required to produce a correlation map using a coherence selection by gradients rather than by phase cycling. By applying the magnetic field gradient pulses to precisely dephase and then rephase the magnetization, quantum coherence selection is achieved without the need for any phase cycling. Thus, for each discrete evolution time $t_1$, only a single acquisition is required rather than eight or more as required by prior pulse sequences. Since the magnetic field gradient pulses do not increase the length of the pulse sequence, the result is a substantial reduction in the total scan time by a factor of eight or more.

Another object of the invention is to improve the quality of data produced by a gradient selection of coherence. The present invention does not employ difference techniques and, therefore, does not require highly stable measurement conditions over long periods of time. Instead, the effectiveness of the present invention is determined in large part by the accuracy with which the magnetization can be dephased and then rephased, or refocused, by the magnetic field gradient pulses. This is achieved by using actively shielded gradient coils which produce minimal eddy currents in the surrounding structures and by using RF excitation coils which do not conduct significant gradient-induced eddy currents.

A more specific object of the invention is to improve NMR pulse sequences which rely on any quantum coherence selection strategy. The present invention can be employed with quantum coherence selection sequences of any order and it can be employed in sequences which make a plurality of quantum coherence selections in a single sequence. When single quantum coherence is selected, the size of the two magnetic field gradient pulses is the same. When higher order quantum coherence is selected, the rephase magnetic field gradient pulse is larger than the preparation magnetic field gradient pulse by a factor which corresponds with the order being selected. When more than one quantum coherence is selected during a pulse sequence their corresponding magnetic field gradient pulses may be produced separately, or they may be produced concurrently.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1b is a graphic representation of the spectral components produced by the lactate molecule of FIG. 1a;

DETAILED DESCRIPTION OF THE INVENTION

Figure 1A:
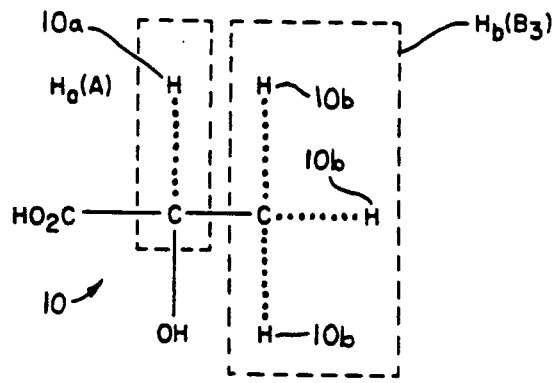
FIG. 1a is a schematic representation of a lactate molecule which produces an NMR signal having a number of spectral components.

Referring initially to FIG. 1a, a typical molecule 10 from which NMR information is to be obtained is illustrated. Molecule 10 is a type $AB_3$ molecule in which scalar coupling exists between a single hydrogen atom 10a, having a single bond with a middle carbon atom in the Ha(A) moiety, and the three hydrogen atoms 10b, each having a bond with an end carbon atom in the $Hb(B_3)$ moiety. When this molecule is subjected to a polarizing magnetic field $B_0$ and a transverse RF excitation field $B_1$ is applied, a NMR signal is produced by this molecule which has a number of resonant peaks.

Since the Ha(A) hydrogen atom 10a can have the spin of its nucleus pointing either up or down, the nuclear spins of the $Hb(B_3)$ atoms 10b encounter one of two different local environments, so that the peak of their resonance is split into a doublet of spectral lines, each of a substantially similar amplitude. Similarly, the three b hydrogen atoms 10b can assume spin configurations with any one of: all three spins pointing in the upward direction, one spin in the downward direction and the other two spins in the upward direction, two spins in the downward direction and one spin in the upward direction, or all three spins in the downward direction. Therefore, the a hydrogen atom 10a sees four different environments and its resonance is split into a quartet of spectral lines, having relative intensities 1:3:3:1.

Figure 1B:
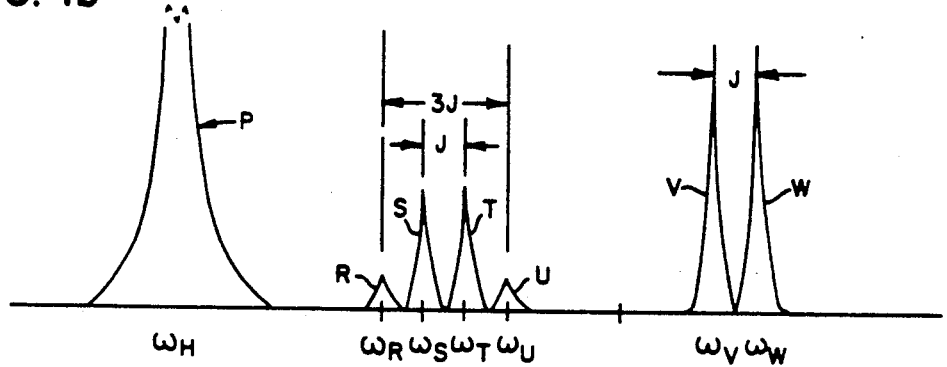

An example of the transformed NMR signal produced by the molecule 10 is shown in FIG. 1b. The NMR signal has been converted to the frequency domain such that its signal components are shown as peaks, or "spectral components", at different frequencies along the horizontal frequency axis. One spectral component produced by the hydrogen nuclei in the water is shown at the frequency $\omega_H$, although it can be appreciated by those skilled in the art that there are typically many other unwanted spectral components present which are produced by uncoupled resonant spin. These other spectral components are often many orders of magnitude greater than the desired spectral components.

The NMR signal components due to the a hydrogen spin resonance Ha(A) of the illustrative molecule 10 provides the quartet of spectral components R, S, T and U at respective frequencies $\omega_R$, $\omega_S$, $\omega_T$ and $\omega_U$. Each of these peaks are separated by the spin-spin coupling constant J. The b hydrogen resonances Hb(B$_3$) provide the doublet spectral components V and W, at respective frequencies $\omega_V$ and $\omega_W$. The separation therebetween is determined by the same spin-spin coupling constant J. The sum of the frequency offsets from the RF transmitter for the two coupled protons (H$_a$ and H$_b$) defines the double quantum modulation frequency (DQMF).

The shift correlation pulse sequence is a sequence in which a pair of RF pulses separated by an evolution period create coherence of the spin populations in the NMR spin system. These coherences evolve during the time period ($t_1$) between RF pulses and with coupled spins this results in the phase modulation of the detected NMR signal. Spin resonances which are coupled exhibit modulation frequencies which can be exploited to correlate coupled spin resonances. The present invention enables this phenomena to be used in the production of correlation maps without the need for time consuming phase cycling.

Figure 3:
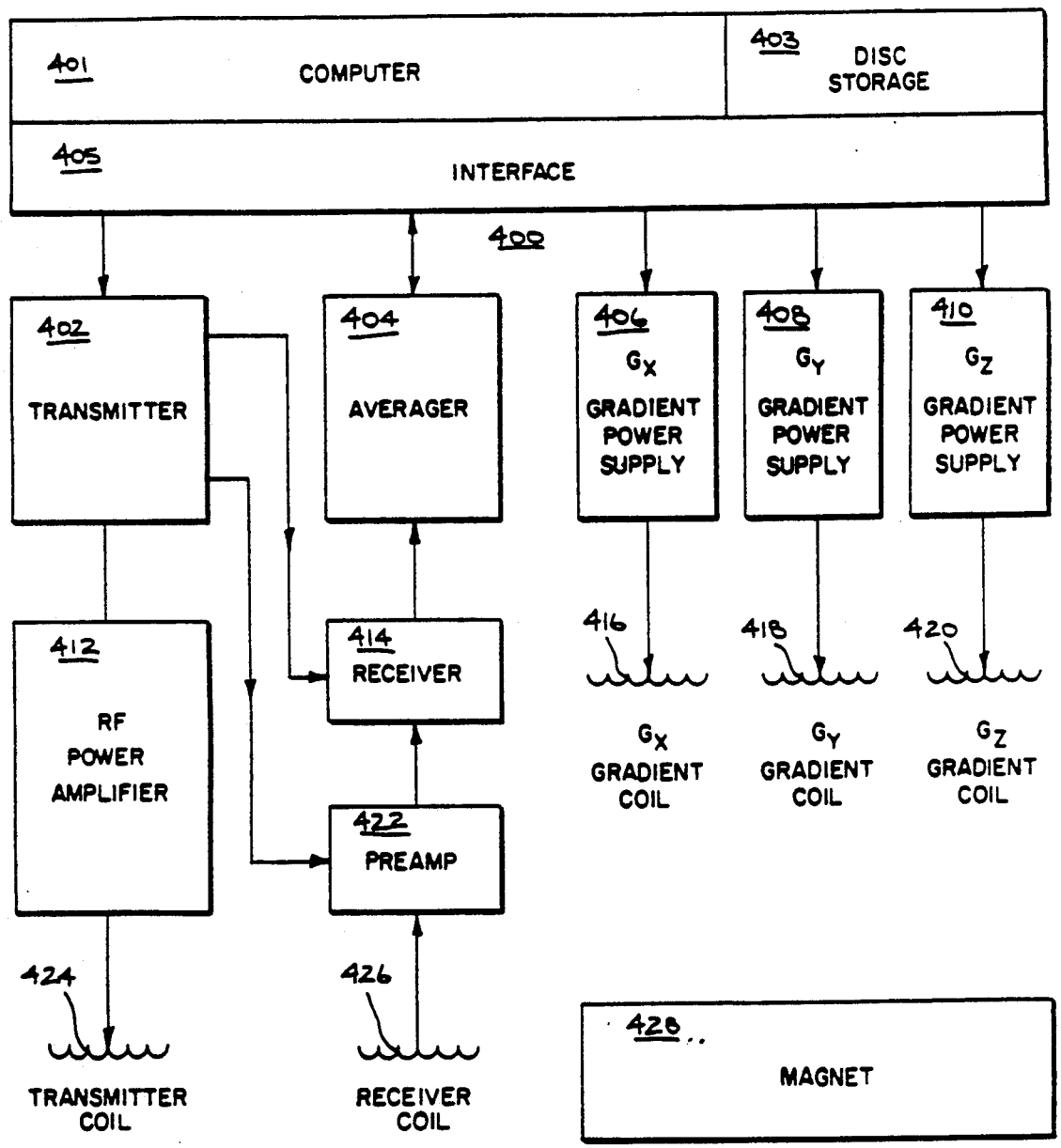
FIG. 3 is a simplified schematic diagram of the NMR system which employs the present invention.

FIG. 3 is a simplified block diagram of the major components of an NMR system suitable for acquiring the data according to the present invention. The system, generally designated 400, is made up of a general purpose minicomputer 401 which is functionally coupled to disk storage unit 403 and an interface unit 405. An RF transmitter 402, signal averager 404, and gradient power supplies 406, 408 and 410 for energizing, respectively, $G_x$, $G_y$ and $G_z$ gradient coils 416, 418, and 420, are coupled to computer 401 through interface unit 405.

RF transmitter 402 contains an RF oscillator oscillating at the desired Larmor frequency. The transmitter is gated with pulse envelopes from computer 401 to generate RF pulses having the required modulation to excite resonance in the object under study. The RF pulses are amplified in RF power amplifier 412 to levels varying from 100 watts to several kilowatts and applied to transmitter coil 424.

The NMR signal is sensed by receiver coil 426, amplified in a low noise preamplifier 422, and applied for further amplification, detection, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for NMR pulses, blanking for the preamplifier and RF power amplifier, and voltage waveforms for the gradient power supplies. It also advances the gradients and the frequency of RF pulses during scanning. The computer also performs data processing such as Fourier transforms, data filtering, and storage functions.

Figure 7:
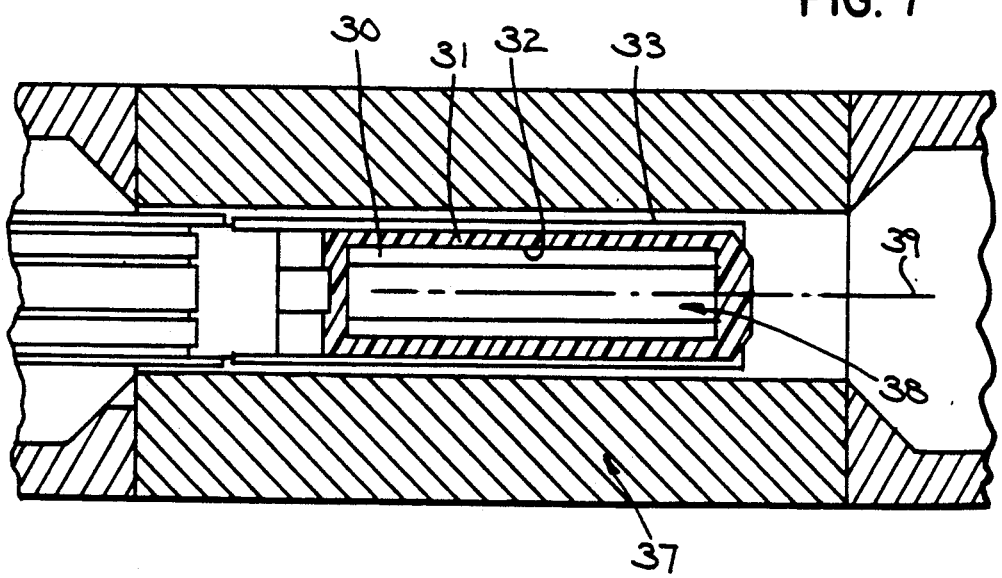
FIG. 7 is a pictorial view of an RF coil employed in the NMR system of FIG. 3.

Referring particularly to FIG. 7, the transmit coil 424 and the receive coil 426 are formed on a cylindrical glass insert 30 that is supported in a holder 31 made of a nonconductive material such as the ceramic sold under the trademark "MACOR". An RF shield 32 is formed by a thin 1 mil copper sheet that is bonded to the inner surface of the holder 31. The probe is further supported by a nonconductive cover 33. A sample volume 38 is thus provided which receives a NMR sample tube (not shown).

Figure 6:
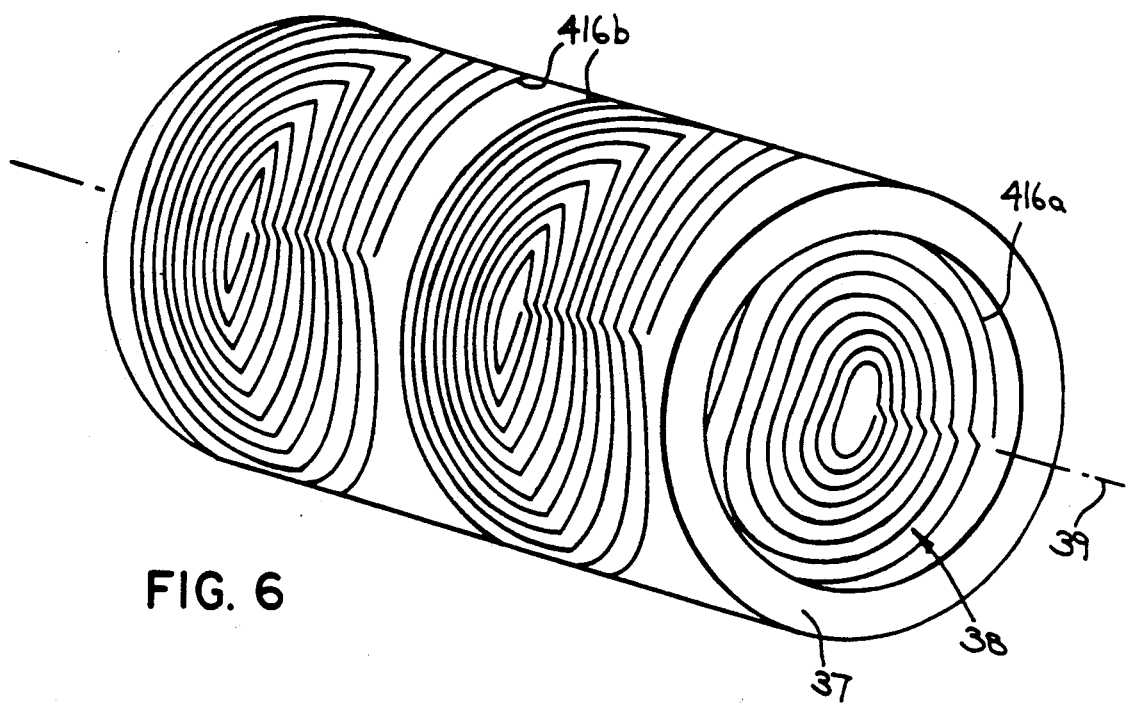
FIG. 6 is a pictorial view of the actively shielded gradient coils employed in the NMR system of FIG. 3.

Magnetic field gradient coils 416, 418, and 420 (FIG. 3) are necessary to provide gradients $G_x$, $G_y$ and $G_z$, respectively. In the NMR pulse sequences described herein, the gradients should be monotonic and linear over the region of interest. And most importantly, the gradient fields produced by the coils 416, 418 and 420 must be precise in their amplitude and duration since the accuracy of the measurements depends upon the ability of the NMR system to dephase the transverse magnetization by a selected amount and to then rephase by the same selected amount. This requires not only that the gradient coils produce the commanded magnetic fields, but that those fields are not distorted by eddy currents induced in conductive elements such as the RF coils 424 and 426 and the surrounding structures used to produce the polarizing magnetic field. Accordingly, it is a teaching of the present invention that actively shielded gradient coils be employed such as those described in U.S. Pat. No. 4,737,716 which issued on Apr. 12, 1988, which is entitled "Self-Shielded Gradient Coils for Nuclear Magnetic Resonance Imaging," and which is incorporated herein by reference. Shielded gradient coils 416 for producing the $G_x$ magnetic field gradient are illustrated in FIG. 6. These include two coil sets 416$a$ and 416$b$ which are connected in series to conduct the same current from the gradient amplifiers. One set of gradient coils 416$a$ is located radially inward from the second set of gradient coils 416$b$ and both are formed on a cylindrical insulating sleeve 37. The current flowing through the gradient coils 416$a$ produces the desired magnetic field gradient pattern within the region of interest 38 along the central axis 39, and the same current flows through the gradient coils 416$b$ to produce a magnetic field that precisely cancels the magnetic field produced outside the central region of interest 38. Thus, the gradient field does not reach the surrounding polarizing magnet structure (not shown) and does not induce eddy currents therein which would otherwise distort the magnetic field gradient in the region of interest 38.

Figure 2:
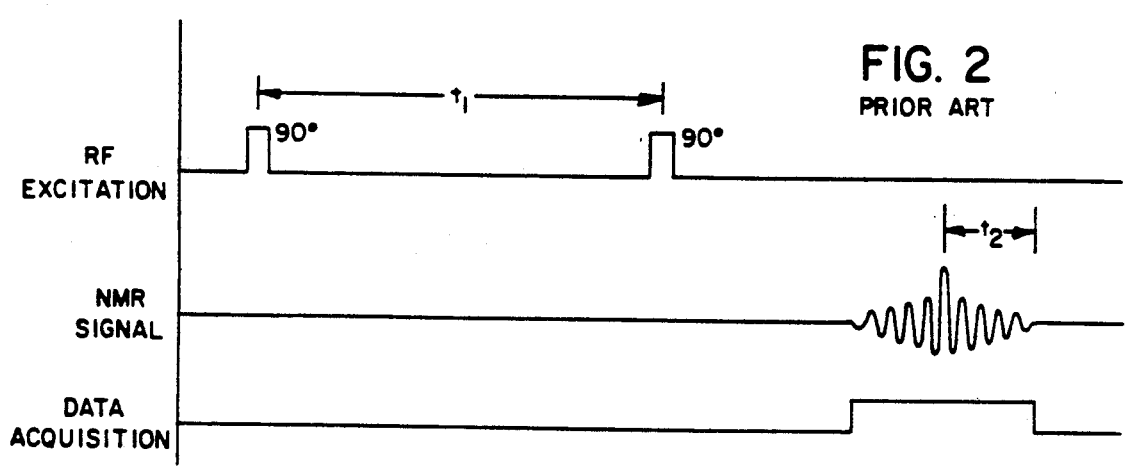
FIG. 2 is a graphic representation of the prior art, COSY sequence employed in an NMR spectrometer.
Figure 4:
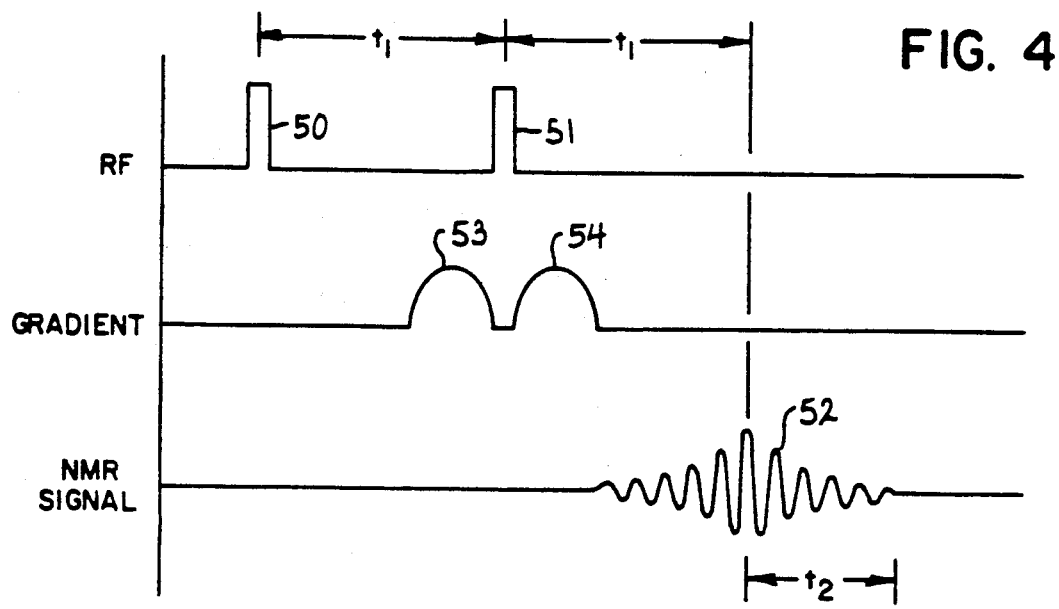
FIG. 4 is a first embodiment of the pulse sequence of the present invention.

The first preferred embodiment of the invention employs a COSY pulse sequence illustrated in FIG. 4. As with the conventional COSY sequence shown in FIG. 2, the improved sequence employs a pair of 90° RF excitation pulses 50 and 51 separated by an evolution period $t_1$. An NMR echo signal 52 is produced after production of the second RF excitation pulse 51, and it is acquired and digitized over a time period $t_2$. A series of such measurements are conducted with the value of $t_1$ incrementally stepped through a series of values. A two dimensional array of NMR data is thus acquired with the values of $t_1$ disposed along one dimension of the array and the values of $t_2$ disposed along the other dimension. When a two dimensional Fourier transform is performed on this NMR data array, it is transformed to the frequency domain and used to produce a two dimensional correlation map.

In contrast to the conventional COSY measurement, however, the pulse sequence of the present invention employs a pair of gradient pulses 53 and 54 to select the desired coherence. The gradient pulses 53 and 54 are disposed on each side of the second RF pulse 51 and they are precisely the same in magnitude. The first gradient pulse 53 dephases the transverse magnetization produced by the first RF pulse 50, the second RF pulse 51 and the second gradient pulse 54 refocuses the desired, dephased transverse magnetization to produce the NMR echo signal 52. No phase cycling is required when the gradient pulses 53 and 54 are employed to select coherence, and thus, only a single measurement is required for each value of $t_1$. This is substantially quicker than the eight or more measurements required by the conventional COSY sequence.

To provide meaningful results, however, it is imperative that the magnitudes of the gradient pulses 53 and 54 be precisely controlled to rephase the transverse magnetization by exactly the same selected amount that it was dephased. In the preferred embodiment this is achieved by producing two gradient pulses of identical shape and peak amplitude, but it should be apparent that the term "magnitude" as used herein refers to the total area under the applied gradient pulse waveform. Thus a second gradient pulse of equal magnitude can be produced with a pulse of shorter duration, higher amplitude or with a pulse of longer duration, lower amplitude than the first gradient pulse.

In the first preferred embodiment a spectrum of strychnine was obtained as a 512 by 512 array of NMR data in a 9.4 Tesla polarizing magnetic field. The transformed array had a spectral width in both dimensions of 3500 Hertz and a single measurement was conducted at each value of $t_1$ with a pre-delay of 1 second. To select the desired coherence, two millisecond, half-sinusoid gradient pulses 53 and 54 were applied with a maximum gradient of [.]8 Gauss/cm.

Figure 5:
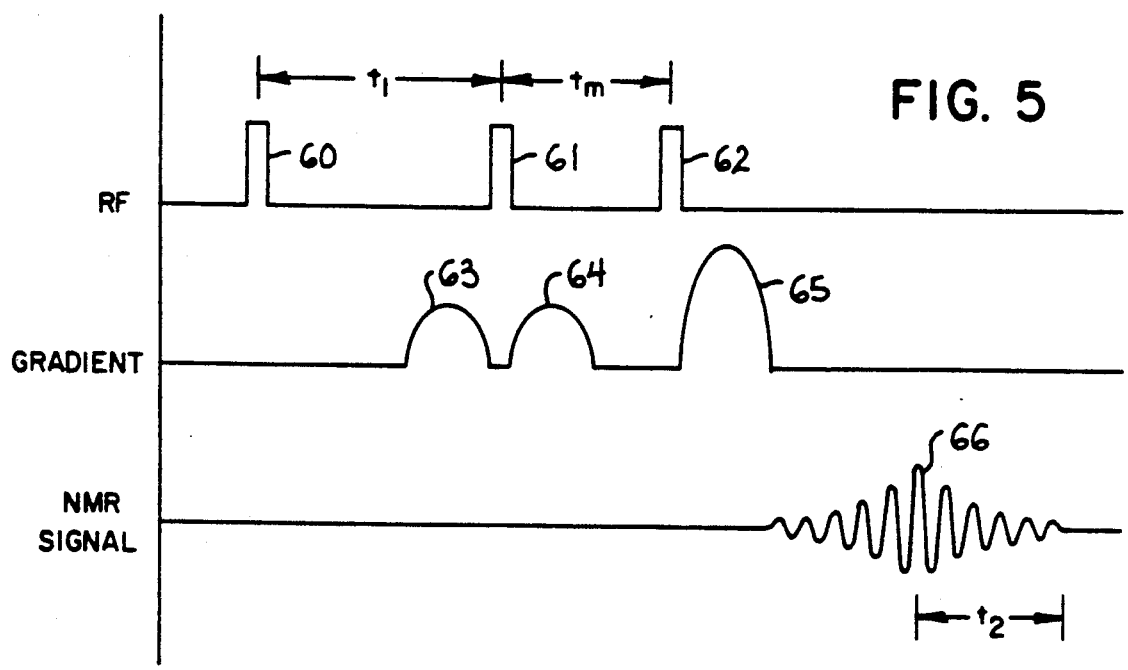
FIG. 5 is a graphic representation of a second embodiment of the pulse sequence of the present invention.

A double quantum version of the COSY measurement is illustrated by the pulse sequence of FIG. 5. In this second preferred embodiment of the invention three 90° RF excitation pulses 60, 61 and 62 are applied to produce a single quantum evolution period $t_1$ and a double quantum evolution period $t_m$. A first gradient pulse 63 is applied during the first evolution period $t_1$ to dephase the transverse magnetization prior to the second RF pulse 61, and a second gradient pulse 64 is applied during the evolution period $t_m$ to dephase the new coherence states generated by the second RF pulse 61. And finally, a third gradient pulse 65 is applied after the third RF pulse 62 to refocus the desired magnetization and produce an echo NMR signal 66. The gradient pulses 63-65 are two milliseconds in duration and they produce gradients having amplitudes of .8 Gauss/cm, .8 Gauss/cm, and $-2.4$ Gauss/cm respectively. One third of the gradient pulse 65 refocuses the single quantum coherence dephased during the $t_1$ evolution period, and two thirds of the gradient pulse 65 serves to refocus the double quantum coherence dephased during the $t_m$ evolution period. The pulse sequence is repeated for a succession of values of $t_1$ to produce a two-dimensional array of NMR data in which one dimension is time $t_2$ and the other dimension is time $t_1$. A correlation map is produced by performing a two-dimensional Fourier transformation on this data array.

As with the COSY sequence of FIG. 4, the magnitudes of the gradient pulses 63, 64 and 65 must be precisely controlled to produce meaningful data, and to accomplish this it has been found necessary to employ actively shielded gradient coils as described above. While high precision is thus required, the benefits are enormous since only a single measurement is required for each value of the evolution time $t_1$ rather than the eight or more measurements required by prior techniques.

We claim:

1. A method for producing an NMR spectrum of a substance located in a region of interest, the steps comprising:

applying a polarizing magnetic field to the substance;

applying a first RF excitation field pulse to the substance to produce transverse magnetization;

applying a first magnetic field gradient pulse to the substance during an evolution period following the application of the first RF excitation field pulse to prepare to select coherences by dephasing the transverse magnetization by a selected amount;

actively shielding the region surrounding the region of interest to prevent eddy currents from being produced in the surrounding structures by the first magnetic field gradient pulse by producing a magnetic filed which substantially cancels the first magnetic field gradient outside the region of interest;

applying a second RF excitation field pulse to the substance at the completion of the evolution period;

applying a second magnetic field gradient pulse to the substance after the second RF excitation field pulse to refocus desired coherences that are dephased by the first magnetic field gradient pulse;

actively shielding the region surrounding the region of interest to prevent eddy currents from being produced in the surrounding structures by the second magnetic field gradient pulse by producing a magnetic filed which substantially cancels the second magnetic field gradient outside the region of interest; and acquiring the NMR signal produced by the refocused transverse magnetization with a receiver coil.

2. The method as recited in claim 1 which includes the further steps of:

applying a third RF excitation field pulse to the subject to establish a second evolution period;

applying a third magnetic field gradient pulse to the substance during the second evolution period to prepare to select desired coherences by dephasing the transverse magnetization by a second selected amount;

actively shielding the region surrounding the region of interest to prevent eddy currents from being produced in the surrounding structures by the third magnetic field gradient pulse; and wherein the magnitude of the second magnetic filed gradient pulse is set to refocus the transverse magnetization that is dephased by both the first and third magnetic field gradient pulses.

3. The method as recited in claim 1 in which coherence of the order N is selected by the application of the first magnetic field gradient pulse and the subsequent second RF excitation field pulse, and the magnitude of the second magnetic field gradient pulse is N times larger than the magnitude of the first magnetic field gradient pulse.

* * * * *